United States Patent
Sung et al.

(10) Patent No.: US 7,090,506 B2
(45) Date of Patent: Aug. 15, 2006

(54) SIGNAL TRANSMISSION DEVICE HAVING FLEXIBLE PRINTED CIRCUIT BOARDS

(75) Inventors: Kuang-Tao Sung, Fongyuan (TW); Jun-Hsian Lao, Keelung (TW)

(73) Assignee: Au Optronics Corp., Hsinchu (TW)

( * ) Notice: Subject to any disclaimer, the term of this patent is extended or adjusted under 35 U.S.C. 154(b) by 9 days.

(21) Appl. No.: 10/921,462

(22) Filed: Aug. 19, 2004

(65) Prior Publication Data

US 2005/0233611 A1    Oct. 20, 2005

(30) Foreign Application Priority Data

Apr. 19, 2004   (TW) ................. 93110823 A (51) Int. Cl.
*H01R 12/00* (2006.01)
*H05K 1/00* (2006.01)
(52) U.S. Cl. ........................ 439/67; 439/581
(58) Field of Classification Search ................. 439/67, 439/581
See application file for complete search history.

(56) References Cited

U.S. PATENT DOCUMENTS

| | | | | |
|---|---|---|---|---|
| 5,418,691 A | * | 5/1995 | Tokura | 361/803 |
| 5,592,365 A | * | 1/1997 | Sugimoto et al. | 361/789 |
| 5,684,550 A | * | 11/1997 | Shibata et al. | 349/62 |
| 6,045,368 A | * | 4/2000 | Cadenhead et al. | 439/67 |
| 2005/0185127 A1 | * | 8/2005 | Fujiyama et al. | 349/149 |

* cited by examiner

*Primary Examiner*—Hae Moon Hyeon
(74) *Attorney, Agent, or Firm*—Thomas, Kayden, Horstemeyer & Risley (57) ABSTRACT

A signal transmission device. The signal transmission device comprises a first and a second flexible printed circuit boards, connecting an display module and a system. The first flexible printed circuit board electrically connects the display module and the system. The second flexible printed circuit board electrically connects the display module and the first flexible printed circuit board, wherein the first and second flexible printed circuit boards are joined by hot bar soldering or anisotropic conductive film (ACF) bonding.

23 Claims, 4 Drawing Sheets

SIGNAL TRANSMISSION DEVICE HAVING FLEXIBLE PRINTED CIRCUIT BOARDS

BACKGROUND OF THE INVENTION

1. Field of the Invention

The present invention relates in general to a signal transmission device and in particular to a signal transmission device communicating multiple signals between a liquid crystal display (LCD) module and a system.

2. Description of the Related Art

Figure 1:
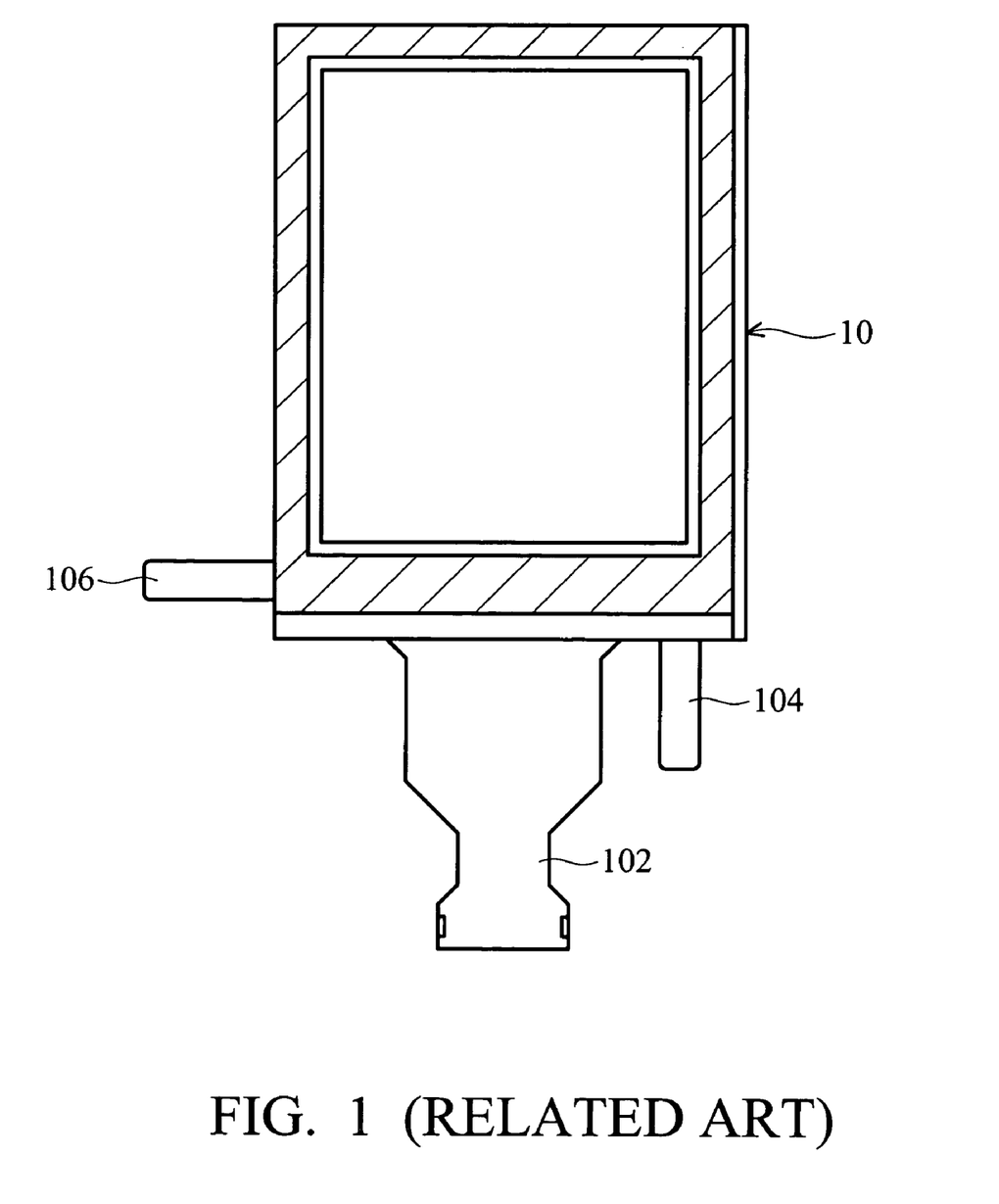
FIG. 1 is a perspective diagram of a conventional signal transmission device connecting an LCD module.

Generally, a conventional touchscreen LCD module comprises an LCD panel, a touch panel and a light source. Referring to FIG. 1, the conventional touchscreen LCD module 10 communicates LCD panel, touch panel and light source signals to a system (not shown) through flexible printed circuit boards 102, 104 and 106. To receive the three types of signals, however, three connecting ports corresponding to the flexible printed circuit boards 102, 104 and 106 are required in the system, thus, it incurring additional fabrication cost and space.

SUMMARY OF THE INVENTION

Accordingly, an object of the present invention is to provide a signal transmission device. The signal transmission device comprises a first and a second flexible printed circuit boards, connecting an LCD module and a system. The first flexible printed circuit board electrically connects the LCD module and the system. The second flexible printed circuit board electrically connects the LCD module and the first flexible printed circuit board, wherein the first and second flexible printed circuit boards are joined by hot bar soldering or anisotropic conductive film (ACF) bonding.

DESCRIPTION OF THE DRAWINGS

The present invention will become more fully understood from the detailed description given hereinbelow and the accompanying drawings, given by way of illustration only and thus not intended to be limitative of the present invention.

FIG. 3b is a side view of the X direction corresponding to FIG. 3a;

FIG. 4b is a side view of the X direction corresponding to FIG. 3a.

DETAILED DESCRIPTION OF THE INVENTION

First Embodiment

Figure 2:
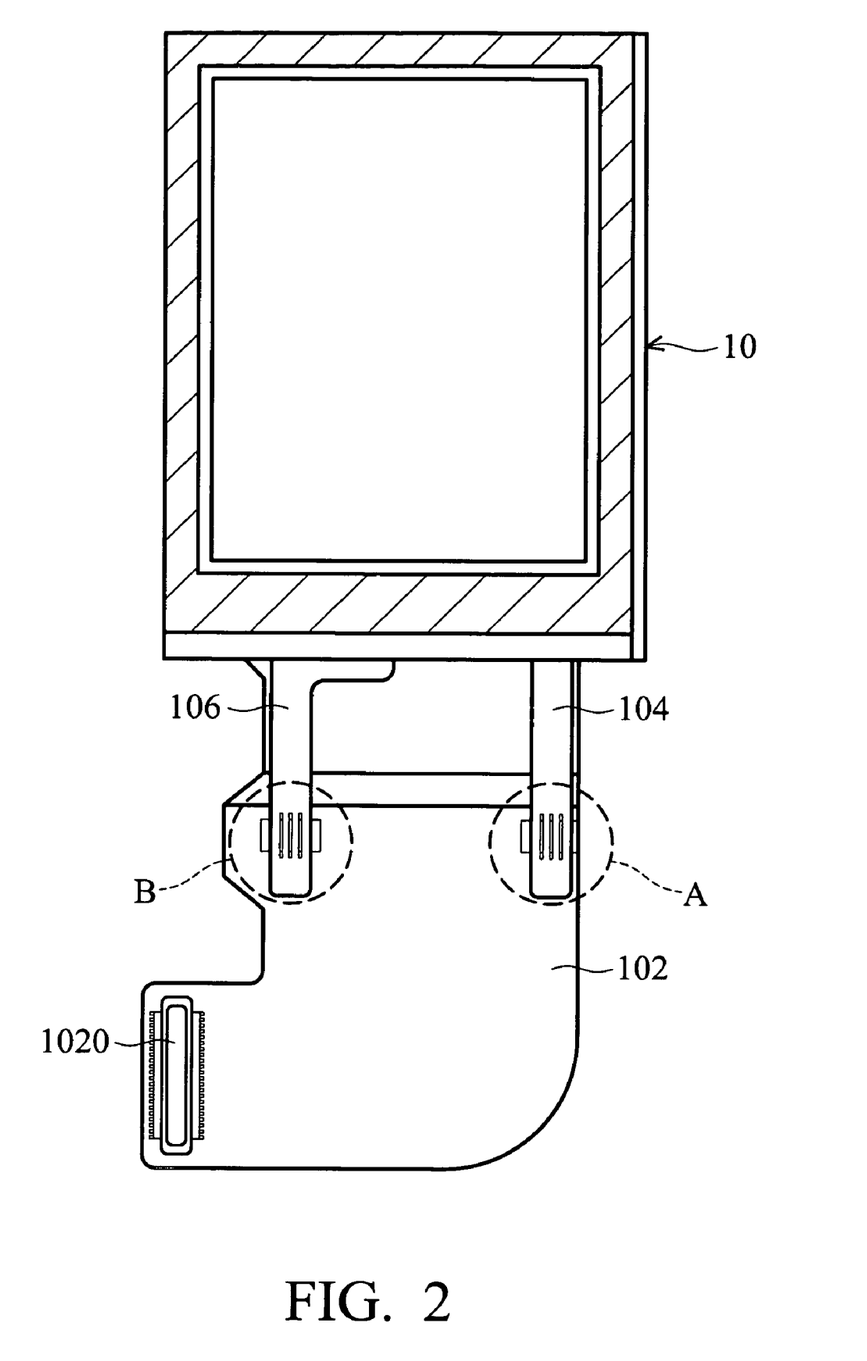
FIG. 2 is a perspective diagram of the signal transmission device in accordance with the present invention.

Referring to FIG. 2, the signal transmission device of the present invention comprises first, second and third flexible printed circuit boards 102, 104 and 106 electrically connecting the touchscreen display module 10 and a system (not shown). The first flexible printed circuit board 102 communicates display panel signal between the touchscreen display module 10 and the system via the connector 1020. Specifically, the second and third flexible printed circuit boards 104 and 106 individually communicate a touch panel signal and a light source signal between the touchscreen display module 10 and the system through the first flexible printed circuit board 102.

As the areas A and B in FIG. 2, the second and third flexible printed circuit boards 104 and 106 are joined to the first flexible printed circuit board 102, thereby touch panel and light source signals from the touchscreen display module 10 can be collected in the first flexible printed circuit board 102 and communicated to the system via the connector 1020. That is, the display panel, touch panel and light source signals are integrated in the first flexible printed circuit board 102 and communicated to the system through a single connector 1020.

Figure 3A:
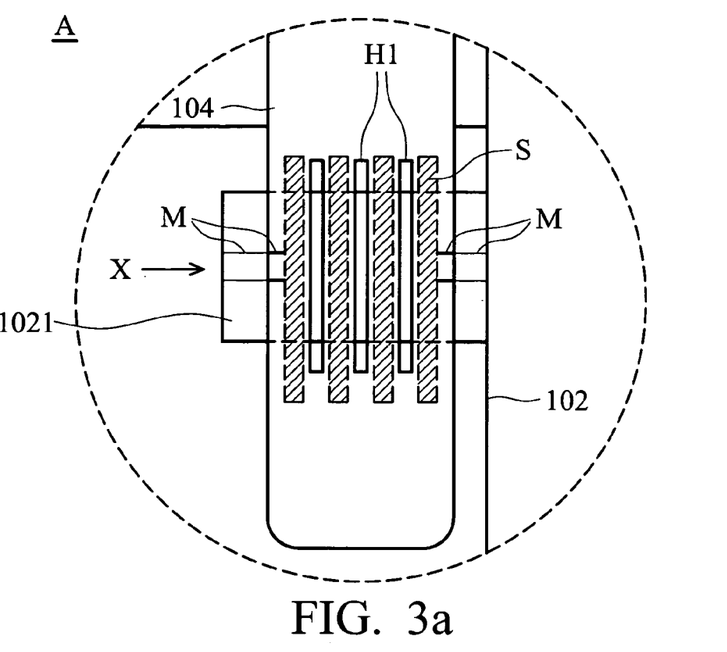
FIG. 3a is a perspective diagram of the first embodiment in accordance with the present invention.
Figure 3B:
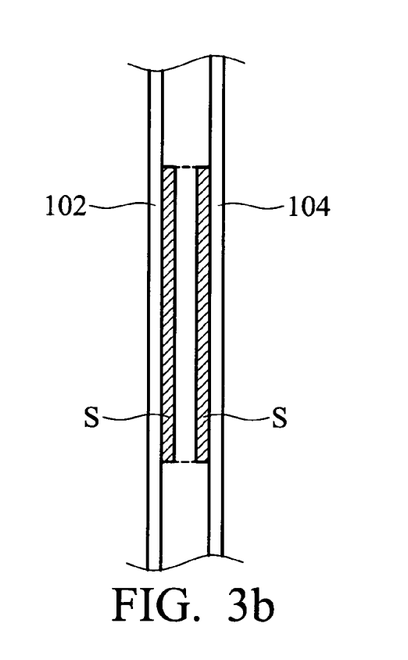

As shown in FIG. 3b, the first and second flexible printed circuit boards 102 and 104 are joined by hot bar soldering via corresponding soldering pads S. Thus, the touch panel signal of the second flexible printed circuit board 104 is collected in the first flexible printed circuit board 102. Referring to FIG. 3a, the second flexible printed circuit board 104 further comprises several longitudinal openings Hi adjacent to the soldering pads S preventing short circuits due to solder overflow. The opening H1, however, can be also disposed in the first flexible printed circuit board 102.

In FIG. 3a, the first flexible printed circuit board 102 defines a connection area 1021 with soldering pads S disposed thereon. Moreover, several alignment marks M are correspondingly disposed around the periphery of the connection area 1021 and the second flexible printed circuit board 104. Accurate positioning and connection is accomplished by aligning the alignment marks M on the first and second flexible printed circuit boards 102 and 104 during assembly. Similarly, the alignment marks M can also be applied to the third flexible printed circuit board 106 for accurate connection of the first flexible printed circuit board 102 as shown by the area B in FIG. 2.

Second Embodiment

Figure 4A:
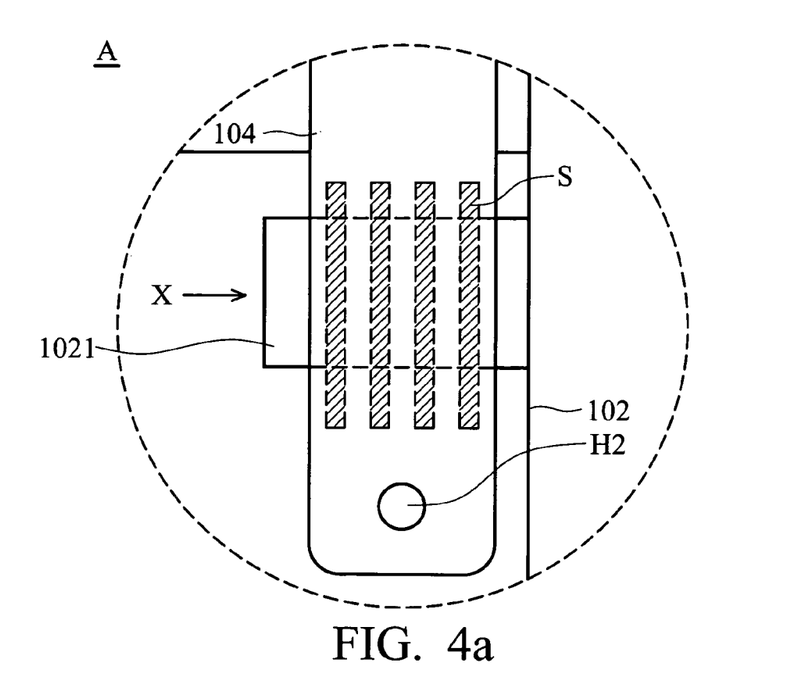
FIG. 4a is a perspective diagram of the second embodiment in accordance with the present invention.
Figure 4B:
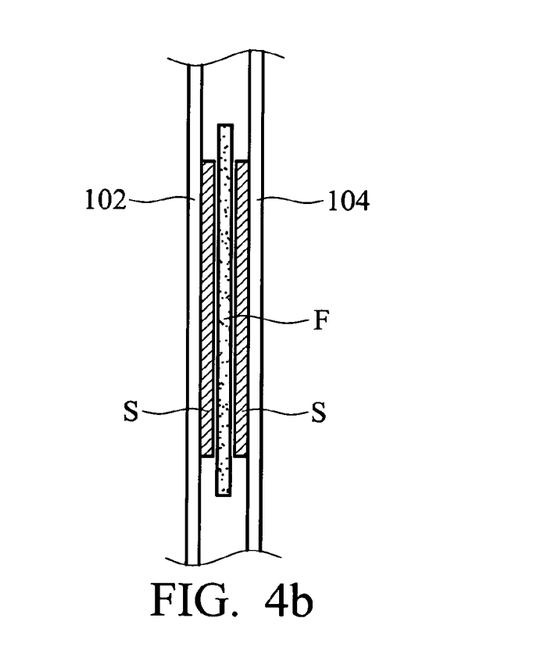

Referring to FIGS. 4a and 4b, the first and second flexible printed circuit boards 102 and 104 are joined by anisotropic conductive film (ACF) bonding via corresponding soldering pads S. As shown in FIG. 4b, an anisotropic conductive film F is electrically bonded between the soldering pads S of the first and second flexible printed circuit boards 102 and 104. Thus, the touch panel signal of the second flexible printed circuit board 104 can be collected in the first flexible printed circuit board 102.

In FIG. 4a, the first and second flexible printed circuit boards 102 and 104 are aligned via alignment holes H2. Accurate positioning and connection is accomplished by aligning the alignment holes H2 of the first and second flexible printed circuit board 102 and 104. Similarly, the alignment hole H2 can also be applied to the third flexible printed circuit board 106 for accurate connection of the first flexible printed circuit board 102 as shown by the area B in FIG. 2.

In summary, the present invention provides a signal transmission device capable of collecting touch panel and light source signals together in the first flexible printed circuit board 102. Thus, touch panel, light source and display panel signals between the touchscreen display module 10 and the system can be communicated through a single connector 1020 of the flexible printed circuit board 102. As mentioned, each flexible printed circuit board can be joined by hot bar soldering or anisotropic conductive film (ACF) bonding. Moreover, the alignment marks M or openings H2 can be applied to each flexible printed circuit board for accurate positioning and connection. As only a single connector is required to communicate the multiple signals between the touchscreen display module 10 and the system, fabrication cost and space required for assembly can be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A signal transmission device, connecting a display module and a system, comprising: a first flexible printed circuit board, electrically connecting the display module and the system and a second flexible printed circuit board, electrically connecting the display module and the first flexible printed circuit board, wherein the first and second flexible printed circuit boards are joined by hot bar soldering.

2. The signal transmission device as claimed in claim 1, wherein a first alignment mark of the first flexible printed circuit board is aligned with a second alignment mark of the second flexible printed circuit board.

3. The signal transmission device as claimed in claim 1, wherein the first flexible printed circuit board has a first alignment hole, and the second flexible printed circuit board has a second alignment hole aligned to the first alignment hole.

4. The signal transmission device as claimed in claim 1, wherein the second flexible printed circuit board has an opening adjacent to the connection of the first and second flexible printed circuit boards.

5. The signal transmission device as claimed in claim 1, wherein the first flexible printed circuit board transmits an display panel signal.

6. The signal transmission device as claimed in claim 1, wherein the second flexible printed circuit board transmits a touch panel signal.

7. The signal transmission device as claimed in claim 1, wherein the second flexible printed circuit board transmits a light source signal.

8. The signal transmission device as claimed in claim 1, further comprising a third flexible printed circuit board electrically connecting the display module and the first flexible printed circuit board.

9. A signal transmission device, connecting an display module and a system, comprising: a first flexible printed circuit board, electrically connecting the display module and the system; and a second flexible printed circuit board, electrically connecting the display module and the first flexible printed circuit board, wherein the first and second flexible printed circuit boards are joined by anisotropic conductive film (ACF) bonding.

10. The signal transmission device as claimed in claim 9, wherein a first alignment mark of the first flexible printed circuit board is aligned with a second alignment mark of the second flexible printed circuit board.

11. The signal transmission device as claimed in claim 9, wherein the first flexible printed circuit board has a first alignment hole, and the second flexible printed circuit board has a second alignment hole aligned to the first alignment hole.

12. The signal transmission device as claimed in claim 9, wherein the second flexible printed circuit board has an opening adjacent to the connection of the first and second flexible printed circuit boards.

13. The signal transmission device as claimed in claim 9, wherein the first flexible printed circuit board transmits a display panel signal.

14. The signal transmission device as claimed in claim 9, wherein the second flexible printed circuit board transmits a touch panel signal.

15. The signal transmission device as claimed in claim 9, wherein the second flexible printed circuit board transmits a light source signal.

16. The signal transmission device as claimed in claim 9 further comprising a third flexible printed circuit board electrically connecting the display module and the first flexible printed circuit board.

17. A signal transmission device, connecting an display module and a system, comprising:
    a first flexible printed circuit board, electrically connecting the display module and the system; and
    a second flexible printed circuit board, electrically connecting the display module and the first flexible printed circuit board, wherein the first flexible printed circuit board has a first alignment mark, and the second flexible printed circuit board has a second alignment mark overlapped with and aligned to the first alignment mark.

18. The signal transmission device as claimed in claim 17, wherein the first flexible printed circuit board further has a first alignment hole, and the second flexible printed circuit board further has a second alignment hole aligned to the first alignment hole.

19. The signal transmission device as claimed in claim 17, wherein the second flexible printed circuit board further has an opening adjacent to the connection of the first and second flexible printed circuit boards.

20. The signal transmission device as claimed in claim 17, wherein the first flexible printed circuit board transmits an display panel signal.

21. The signal transmission device as claimed in claim 17, wherein the second flexible printed circuit board transmits a touch panel signal.

22. The signal transmission device as claimed in claim 17, wherein the second flexible printed circuit board transmits a light source signal.

23. The signal transmission device as claimed in claim 17, further comprising a third flexible printed circuit board electrically connecting the display module and the first flexible printed circuit board.

* * * * *

(12) EX PARTE REEXAMINATION CERTIFICATE (8263rd)
United States Patent
Sung et al.

(10) Number: US 7,090,506 C1
(45) Certificate Issued: May 24, 2011

(54) SIGNAL TRANSMISSION DEVICE HAVING FLEXIBLE PRINTED CIRCUIT BOARDS (75) Inventors: Kuang-Tao Sung, Fongyuan (TW); Jun-Hsian Lao, Keelung (TW)

(73) Assignee: Au Optronics Corp., Science-Based Industrial Park, Hsinchu (TW)

Reexamination Request:
No. 90/009,613, Dec. 1, 2009

Reexamination Certificate for:
Patent No.: 7,090,506
Issued: Aug. 15, 2006
Appl. No.: 10/921,462
Filed: Aug. 19, 2004

(30) Foreign Application Priority Data

Apr. 19, 2004 (TW) .......................... 93110823 A (51) Int. Cl.
H01R 4/02 (2006.01)
H01R 12/00 (2006.01)
G02F 1/13 (2006.01)
G09F 9/00 (2006.01)
H05K 1/00 (2006.01)
H05K 1/02 (2006.01)
H05K 1/14 (2006.01)
H05K 3/36 (2006.01)

(52) U.S. Cl. .......................... 439/67; 439/581
(58) Field of Classification Search .......... 439/67
See application file for complete search history.

(56) References Cited

U.S. PATENT DOCUMENTS 5,418,691 A  5/1995  Tokura
5,982,626 A  11/1999 Kodama
6,045,368 A  4/2000  Cadenhead et al.
6,223,973 B1 5/2001  Wong et al.
6,972,966 B1 12/2005 Oishi et al.

FOREIGN PATENT DOCUMENTS

| JP | S53-83077 A | 7/1978 |
| JP | S36-104306 A | 5/1988 |
| JP | H4-249395 A | 9/1994 |
| JP | H7-335693 A | 12/1995 |
| JP | H9-130001 A | 5/1997 |
| JP | 10-173304 A | 6/1998 |
| JP | H11-316554 A | 11/1999 |
| JP | 2001-20209 A | 7/2001 |
| JP | 2003-143030 A | 5/2003 |
| JP | 2003-195120 A | 7/2003 |
| JP | 2003-258396 A | 9/2003 |

*Primary Examiner*—Erik Kielin (57) ABSTRACT

A signal transmission device. The signal transmission device comprises a first and a second flexible printed circuit boards, connecting an display module and a system. The first flexible printed circuit board electrically connects the display module and the system. The second flexible printed circuit board electrically connects the display module and the first flexible printed circuit board, wherein the first and second flexible printed circuit boards are joined by hot bar soldering or anisotropic conductive film (ACF) bonding.

At the time of issuance and publication of this certificate, the patent remains subject to pending reexamination control number 90/011,465 filed Jan. 31, 2011. The claim content of the patent may be subsequently revised if a reexamination certificate issues from the reexamination proceeding.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1 and 4 are confirmed.

Claims 10 and 12 are cancelled.

Claims 5, 9 and 17 are determined to be patentable as amended.

Claims 11, 13-16 and 18-23, dependent on an amended claim are, determined to be patentable.

New claim 24 is added and determined to be patentable.

Claims 2, 3 and 6-8 were not reexamined.

5. The signal transmission device as claimed in claim 1, wherein the first flexible printed circuit board transmits [an] *a* display panel signal.

9. A signal transmission device, connecting an display module and a system, comprising:
  a first flexible printed circuit board, electrically connecting the display module and the system; and
  a second flexible printed circuit board, electrically connecting the display module and the first flexible printed circuit board, wherein the first and second flexible printed circuit boards are joined by anisotropic conductive film (ACF) bonding, *the first flexible printed circuit board has a first alignment mark, and the second flexible printed circuit board has a second alignment mark overlapped with and aligned to the first alignment mark.*

17. A signal transmission device, connecting [an] *a* display module and a system comprising:
  a first flexible printed circuit board, electrically connecting the display module and the system; and
  a second flexible printed circuit board, electrically connecting the display module and the first flexible printed circuit board, wherein the first flexible printed circuit board has a first alignment mark, and the second flexible printed circuit board has a second alignment mark overlapped with and aligned to the first alignment mark.

24. *The signal transmission device as claimed in claim 9, wherein the second flexible printed circuit board has an opening adjacent to the connection of the first and second flexible printed circuit boards.*

\* \* \* \* \*

(12) INTER PARTES REEXAMINATION CERTIFICATE (556th)
United States Patent
Sung et al.

(10) Number: US 7,090,506 C2
(45) Certificate Issued: Mar. 12, 2013

(54) SIGNAL TRANSMISSION DEVICE HAVING FLEXIBLE PRINTED CIRCUIT BOARDS

(75) Inventors: Kuang-Tao Sung, Fongyuan (TW); Jun-Hsian Lao, Keelung (TW)

(73) Assignee: Au Optronics Corp., Science-Based Industrial Park, Hsinchu (TW)

Reexamination Request:
No. 95/001,655, Jun. 10, 2011

No. 90/011,465, Jan. 31, 2011

Reexamination Certificate for:
Patent No.: 7,090,506
Issued: Aug. 15, 2006
Appl. No.: 10/921,462
Filed: Aug. 19, 2004

Reexamination Certificate C1 7,090,506 issued May 24, 2011

(30) Foreign Application Priority Data

Apr. 19, 2004 (TW) .............................. 93110823 A (51) Int. Cl.
*H01R 4/02* (2006.01)
*H01R 12/00* (2006.01)
*G02F 1/13* (2006.01)
*G09F 9/00* (2006.01)
*H05K 1/00* (2006.01)
*H05K 1/02* (2006.01)
*H05K 1/14* (2006.01)
*H05K 3/36* (2006.01)

(52) U.S. Cl. .......................................... 439/67; 439/581
(58) Field of Classification Search ....................... None
See application file for complete search history.

(56) References Cited

To view the complete listing of prior art documents cited during the proceedings for Reexamination Control Numbers 95/001,655 and 90/011,465, please refer to the USPTO's public Patent Application Information Retrieval (PAIR) system under the Display References tab.

*Primary Examiner* — Erik Kielin (57) ABSTRACT

A signal transmission device. The signal transmission device comprises a first and a second flexible printed circuit boards, connecting an display module and a system. The first flexible printed circuit board electrically connects the display module and the system. The second flexible printed circuit board electrically connects the display module and the first flexible printed circuit board, wherein the first and second flexible printed circuit boards are joined by hot bar soldering or anisotropic conductive film (ACF) bonding.

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 10 and 12 were previously cancelled.
Claims 1-9, 11 and 13-24 are cancelled.

\* \* \* \* \*